United States Patent
Yamamoto et al.

(10) Patent No.: US 7,896,562 B2
(45) Date of Patent: *Mar. 1, 2011

(54) DEVELOPING METHOD, DEVELOPING APPARATUS AND STORAGE MEDIUM

(75) Inventors: Taro Yamamoto, Koshi (JP); Hirofumi Takeguchi, Koshi (JP); Atsushi Ookouchi, Koshi (JP); Kousuke Yoshihara, Koshi (JP)

(73) Assignee: Tokyo Electron Limited, Tokyo-to (JP)

( * ) Notice: Subject to any disclaimer, the term of this patent is extended or adjusted under 35 U.S.C. 154(b) by 202 days.

This patent is subject to a terminal disclaimer.

(21) Appl. No.: 12/173,285

(22) Filed: Jul. 15, 2008

(65) Prior Publication Data

US 2009/0035021 A1 Feb. 5, 2009

(30) Foreign Application Priority Data

Jul. 30, 2007 (JP) ............................. 2007-197889

(51) Int. Cl.
 *G03D 5/00* (2006.01)
 *G03B 27/32* (2006.01)
 *B05C 11/02* (2006.01)
(52) U.S. Cl. ........................... 396/611; 355/27; 118/52
(58) Field of Classification Search .................. 396/611
 See application file for complete search history.

(56) References Cited

U.S. PATENT DOCUMENTS

| 6,191,053 B1* | 2/2001 | Chun et al. .................. 438/780 |
| 7,665,918 B2* | 2/2010 | Yamamoto et al. .......... 396/611 |
| 2009/0130614 A1* | 5/2009 | Ookouchi et al. ............ 430/434 |

FOREIGN PATENT DOCUMENTS

JP 2005-210059 8/2005

* cited by examiner

*Primary Examiner*—Rodney E Fuller
(74) *Attorney, Agent, or Firm*—Oblon, Spivak, McClelland, Maier & Neustadt, L.L.P.

(57) ABSTRACT

A method of supplying a developing solution is provided. The method includes supplying a developing solution onto a substrate from a first developing solution nozzle, so as to form a ribbon-like region on the surface of the substrate, while rotating the substrate about a vertical axis via a substrate holding part. The method further includes shifting a position of the ribbon-like region in which the developing solution is supplied. Developing solution is supplied from a second developing solution nozzle, so as to form a circular region on the central portion of the substrate or form a ribbon-like region shorter in length than the ribbon-like region of the developing solution supplied from the first developing nozzle. Simultaneously, the substrate is rotated about the vertical axis via the substrate holding part, thereby spreading the developing solution toward a peripheral portion of the substrate by centrifugal force.

24 Claims, 13 Drawing Sheets

$t_1$: THE DISCHARGE REGION OR PROJECTION OF THE DISCHARGING HOLE OF THE SECOND DEVELOPING SOLUTION NOZZLE IS MOVED TO THE CENTER OF THE WAFER (a)
(BACKGROUND ART)
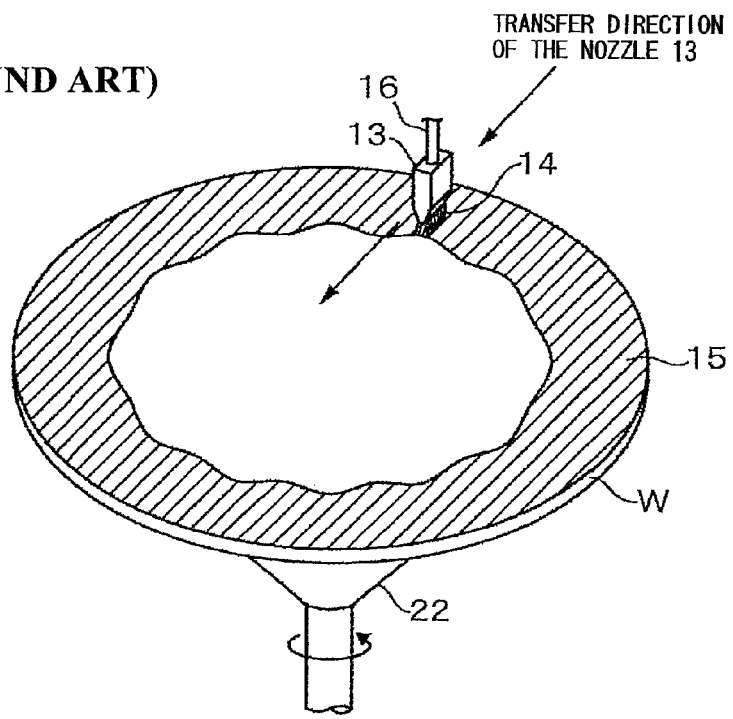
(b)
(BACKGROUND ART)
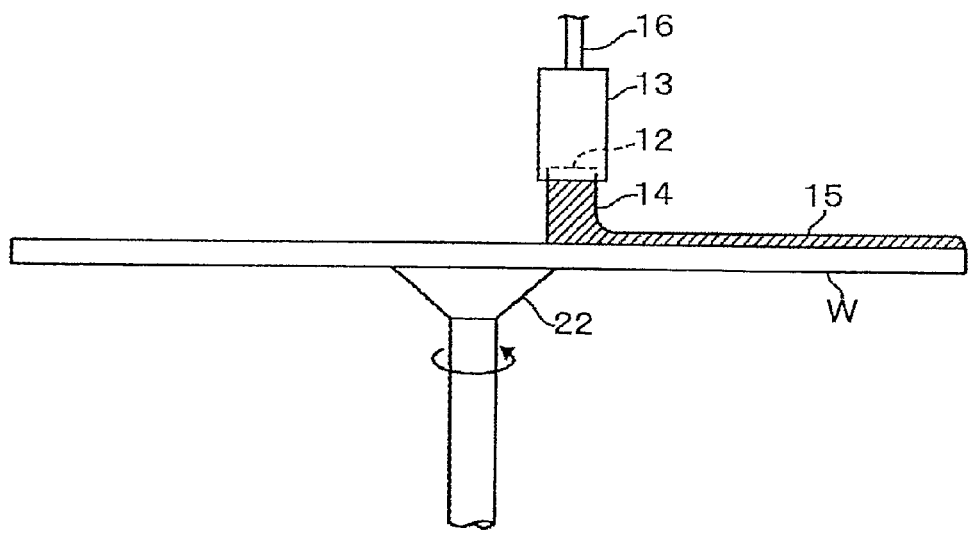
FIG. 14

DEVELOPING METHOD, DEVELOPING APPARATUS AND STORAGE MEDIUM

CROSS REFERENCE TO RELATED APPLICATIONS

This application is based on the prior Japanese Patent Application No. 2007-197889 filed on Jul. 30, 2007, the entire contents of which are incorporated herein by reference.

BACKGROUND OF THE INVENTION

1. Field of the Invention

The present invention relates to a developing method, a developing apparatus and a storage medium, for use in developing a substrate having a surface that has been coated with a resist and exposed to light.

2. Background Art

In a photo-resist step that is one of steps for producing semiconductors, a resist pattern is formed by coating the resist on the surface of each semiconductor wafer (hereinafter, referred to as a "wafer"), exposing the coated resist to light via a predetermined pattern, and finally developing the resist. Such a process is generally carried out by using a system, in which an exposure apparatus is connected with a coating and developing apparatus adapted for coating and developing the resist.

In a typical example of conventional developing processes, the wafer is held, horizontally, on a substrate holding part, and a developing solution nozzle having fine discharging holes formed therein is then located in a position slightly separated or floated away over the wafer surface. Thereafter, the wafer is rotated about a vertical axis, while the developing solution nozzle is moved in a radial direction relative to the rotation of the wafer, with the developing solution being discharged from the developing solution nozzle. Thus, the developing solution can be supplied onto the wafer surface in a spiral state. After being supplied with the developing solution in such a manner, the wafer is held at rest until a predetermined developing time passes by. Then, a rinsing liquid is supplied onto the wafer in order to wash away the developing solution. Such a developing process is commonly referred to as a paddling-type developing method.

However, such a paddling-type developing method requires a greater amount of the developing solution. To address this problem, another method, as described in Patent Document 1, for performing the developing process, by discharging the developing solution onto the substrate while rotating the substrate, has been studied. Now, this developing method will be described in brief with reference to FIGS. 14(a), 14(b). First, the wafer W is rotated about the vertical axis via a spin chuck 22 that is the substrate holding part, while the developing solution nozzle 13 is moved from a peripheral portion toward a central portion of the wafer W, wherein the developing solution nozzle 13 includes a slit-like discharging hole 12 extending in a direction from the peripheral portion toward the central portion of the wafer W, as is shown by an arrow in the drawing. During this operation, the developing solution 14 is discharged, in a ribbon-like state, from the discharging hole 12, as such the developing solution 14 can be supplied onto the surface of the wafer W, in a spiral state. In this way, the whole surface of the wafer W can be covered with a liquid film or layer 15 of the developing solution 14. Even after the developing solution nozzle 13 has reached a position above the central portion of the wafer W and the whole surface of the wafer W has been covered with the developing solution 14, the developing solution nozzle 13 should continue to supply the developing solution 14 onto the central portion of the wafer W in order to prevent the liquid film 15 from being dried up. After a while, once the resist pattern is formed in the resist on the wafer surface by the developing process, the rinsing liquid is discharged onto the resist by a rinsing nozzle (not shown) so as to wash away the developing solution 14. In this way, the developing process is completed.

In the case of forming the liquid film 15 of the developing solution 14 on the wafer W, by employing the developing process, as described above, for discharging the developing solution onto the substrate from the nozzle while rotating the substrate, reduction of the time required for the developing process has been aimed at, by setting a transfer speed of the developing solution nozzle 13 at a greater value, as compared with the aforementioned paddling-type developing method for supplying the developing solution 14 onto the wafer surface. In addition, saving of the developing solution 14 has been attempted, by reducing the film thickness of the developing solution 14 on the wafer surface, as compared with the paddling-type developing method. However, when attempting to suppress occurrence of a developing defect or defect in a developed state and ensure uniformity of a preferred CD (i.e., a width of lines in the resist pattern), some resist materials may substantially restrict a process margin. Thus, in some cases, such a developing process, as described above, that aims at significant reduction of the developing time and/or developing solution cannot be applied adequately. Accordingly, substantial reduction or saving of the developing time and developing solution is still a challenge to be studied in performing the developing process.

In order to stabilize a shape of the resist pattern formed after the developing process in the developing method described above, a time in a range of from 10 to 20 seconds is required for removing the liquid film 15, by using the rinsing liquid, after the whole surface of the wafer W has been covered with the liquid film 15. During this period of time, the supply of the developing liquid should be continued, only in a smaller amount, for preventing the drying up of the liquid film 15 already formed. Nevertheless, if the supply of the developing solution 14 is continued, in the same amount that is used for forming the liquid film 15, the attempt of reducing the amount of the developing solution 14 used would not be achieved enough.

Accordingly, it might be envisioned to provide the developing method or apparatus that can optionally change the supply amount of the developing solution from a developing solution supply pipe 16 to the developing solution nozzle 13, in order to substantially reduce the amount of the developing solution discharged from the discharging hole 12 after the formation of the liquid film 15 on the whole surface of the wafer. However, the developing solution nozzle 13 is designed, in itself, such that the flowing speed and supplying pressure of the developing solution can be kept constant at any point in a longitudinal direction of the discharging hole 12, with the developing solution supplied in a predetermined amount. Namely, with such a design, the developing solution can be supplied, stably, in a ribbon-like state, onto the wafer W. Therefore, if the developing solution is supplied to the developing solution nozzle 13, in a smaller amount than the predetermined amount, the discharge of the developing solution 14 from the discharging hole 12 should be unstable, thus making it difficult to perform a normal and adequate developing process, leading to occurrence of the developing defect and/or significant dispersion in the resist pattern.

Accordingly, while the Patent Document 1 describes one aspect of the method for supplying the developing solution several times onto the substrate, it does not teach any measure for addressing the above problem.

Patent Document 1: TOKUKAI No. 2005-210059 (Paragraph [0044], FIG. 5, etc.)

SUMMARY OF THE INVENTION

The present invention was made to solve the above problem, and therefore it is an object of this invention to provide a developing method, a developing apparatus and a storage medium, for use in supplying a developing solution onto a substrate, stably, upon providing the developing process to the substrate after it has been coated with a resist and exposed to light.

One aspect of the present invention is a developing method, comprising the steps of: holding a substrate, horizontally, on a substrate holding part, the substrate having been coated with a resist and then subjected to an exposure process; supplying a developing solution from a first developing solution nozzle onto either one of a central portion or peripheral portion of a surface of the substrate, so as to form a ribbon-like region on the surface of the substrate, while rotating the substrate about a vertical axis via the substrate holding part, wherein one end of the ribbon-like region is oriented toward the central portion of the substrate; shifting a position of the ribbon-like region, in which the developing solution is supplied, from either one of the central portion or peripheral portion of the surface of the substrate toward the other of the central portion or peripheral portion thereof, while orienting the one end of the ribbon-like region of the developing solution toward the central portion of the substrate, thereby forming a liquid film of the developing solution on the surface of the substrate; and supplying the developing solution from a second developing solution nozzle, so as to form a circular region on the central portion of the substrate or form a ribbon-like region shorter in length than the ribbon-like region of the developing solution supplied from the first developing nozzle, in order to prevent the liquid film of the developing solution from being dried up, while rotating the substrate about the vertical axis via the substrate holding part, thereby spreading the developing solution toward the peripheral portion of the substrate by centrifugal force.

Another aspect of the present invention is a developing apparatus, comprising: a substrate holding part adapted for horizontally holding a substrate having been coated with a resist and then subjected to an exposure process; a rotation driving mechanism adapted for rotating the substrate holding part holding the substrate, about a vertical axis; a first developing solution nozzle adapted for supplying a developing solution onto a surface of the substrate, so as to form a ribbon-like region of the developing solution extending in a direction from a central portion toward a peripheral portion of the substrate, while one end of the ribbon-like region is oriented toward the central portion of the substrate, thereby forming a liquid film of the developing solution; a driving mechanism adapted for moving the first developing solution nozzle, so as to shift a position of the ribbon-like region, in which the developing solution is supplied, from either one of the central portion or peripheral portion of the surface of the substrate toward the other of the central portion or peripheral portion thereof, while the one end of the ribbon-like region of the developing solution is oriented toward the central portion of the substrate; and a second developing solution nozzle adapted for supplying the developing solution, so as to form a circular region on the central portion of the substrate or form a ribbon-like region shorter in length than the ribbon-like region of the developing solution supplied from the first developing nozzle, in order to prevent the liquid film of the developing solution from being dried up.

For example, the position in which the developing solution is supplied may be shifted from the peripheral portion toward the central portion of the substrate, by horizontally or laterally moving the first developing solution nozzle. In this case, for example, a flow rate of the developing solution supplied from the second developing solution nozzle is less than the flow rate of the developing solution supplied from the first developing solution nozzle. For example, the first developing solution nozzle may include a first discharging hole having a flat opening, and the second developing solution nozzle may include a second discharging hole having a generally circular opening. In this case, the first developing solution nozzle and second developing solution nozzle may be provided to a common arm provided to the driving mechanism.

Still another aspect of the present invention is a storage medium for storing therein a computer program for driving a computer to perform a developing method, the developing method comprising the steps of: holding a substrate, horizontally, on a substrate holding part, the substrate having been coated with a resist and then subjected to an exposure process; supplying a developing solution from a first developing solution nozzle onto either one of a central portion or peripheral portion of a surface of the substrate, so as to form a ribbon-like region on the surface of the substrate, while rotating the substrate about a vertical axis via the substrate holding part, wherein one end of the ribbon-like region is oriented toward the central portion of the substrate; shifting a position of the ribbon-like region, in which the developing solution is supplied, from either one of the central portion or peripheral portion of the surface of the substrate toward the other of the central portion or peripheral portion thereof, while keeping orienting the one end of the ribbon-like region of the developing solution toward the central portion, thereby forming a liquid film of the developing solution on the surface of the substrate; and supplying the developing solution from a second developing solution nozzle, so as to form a circular region on the central portion of the substrate or form a ribbon-like region shorter in length than the ribbon-like region of the developing solution supplied from the first developing nozzle, in order to prevent the liquid film of the developing solution from being dried up, while rotating the substrate about the vertical axis via the substrate holding part, thereby spreading the developing solution toward the peripheral portion of the substrate by centrifugal force.

According to this invention, the step of forming the liquid film of the developing solution on the substrate is performed by using the first developing solution nozzle adapted for supplying the developing solution onto the surface of the substrate, such that the supplied developing solution will be formed into the ribbon-like region, with one end of the ribbon-like region being oriented toward the central portion of the substrate; and the step of further supplying the developing solution, in order to prevent the drying up of the liquid film of the developing solution, is performed by using the second developing solution nozzle adapted for supplying the developing solution onto the substrate, such that the further supplied developing solution will be formed into the circular shape or ribbon-like region shorter in length than the ribbon-like region of the developing solution supplied from the first developing solution nozzle. By selecting the developing solution nozzles, in this manner, corresponding to the step required, unstable supply of the developing solution onto the substrate can be substantially avoided or suppressed, as compared with the case of supplying the developing solution onto the substrate by using, for example, only the first developing solution nozzle while changing a discharging amount from the nozzle. Since the amount of supplying the developing solution onto the substrate can be controlled, corresponding to the shape formed from the developing solution discharged from each nozzle, the amount of the developing solution to be supplied onto the substrate can be significantly saved.

BRIEF DESCRIPTION OF THE DRAWINGS

FIGS. 14(a) and 14(b) are illustrations showing a developing method performed by using a conventional developing apparatus.

DETAILED DESCRIPTION OF THE INVENTION

Examples

Figure 1:
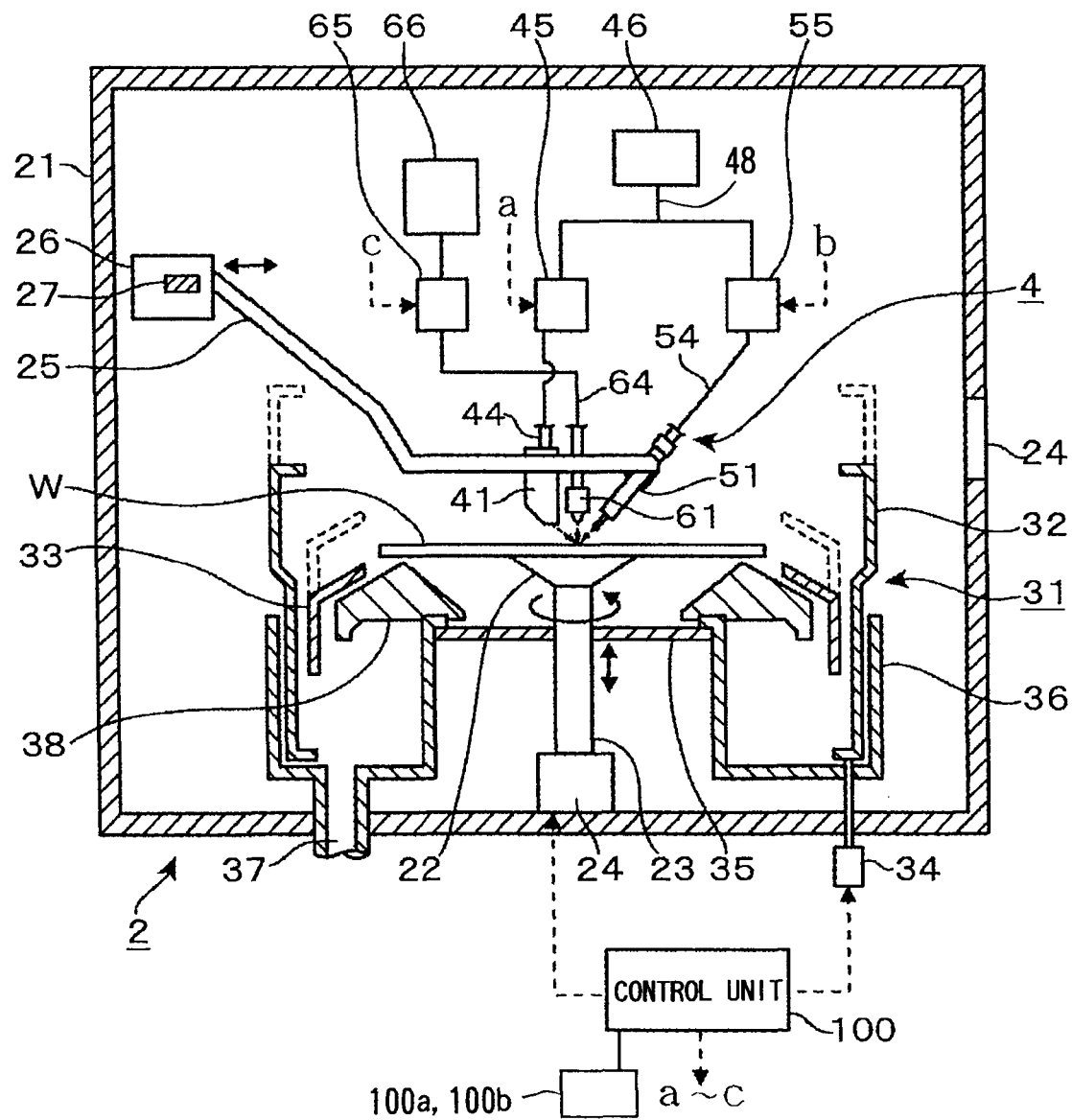
FIG. 1 is a longitudinal side cross section of a developing apparatus related to one embodiment of the present invention.
Figure 2:
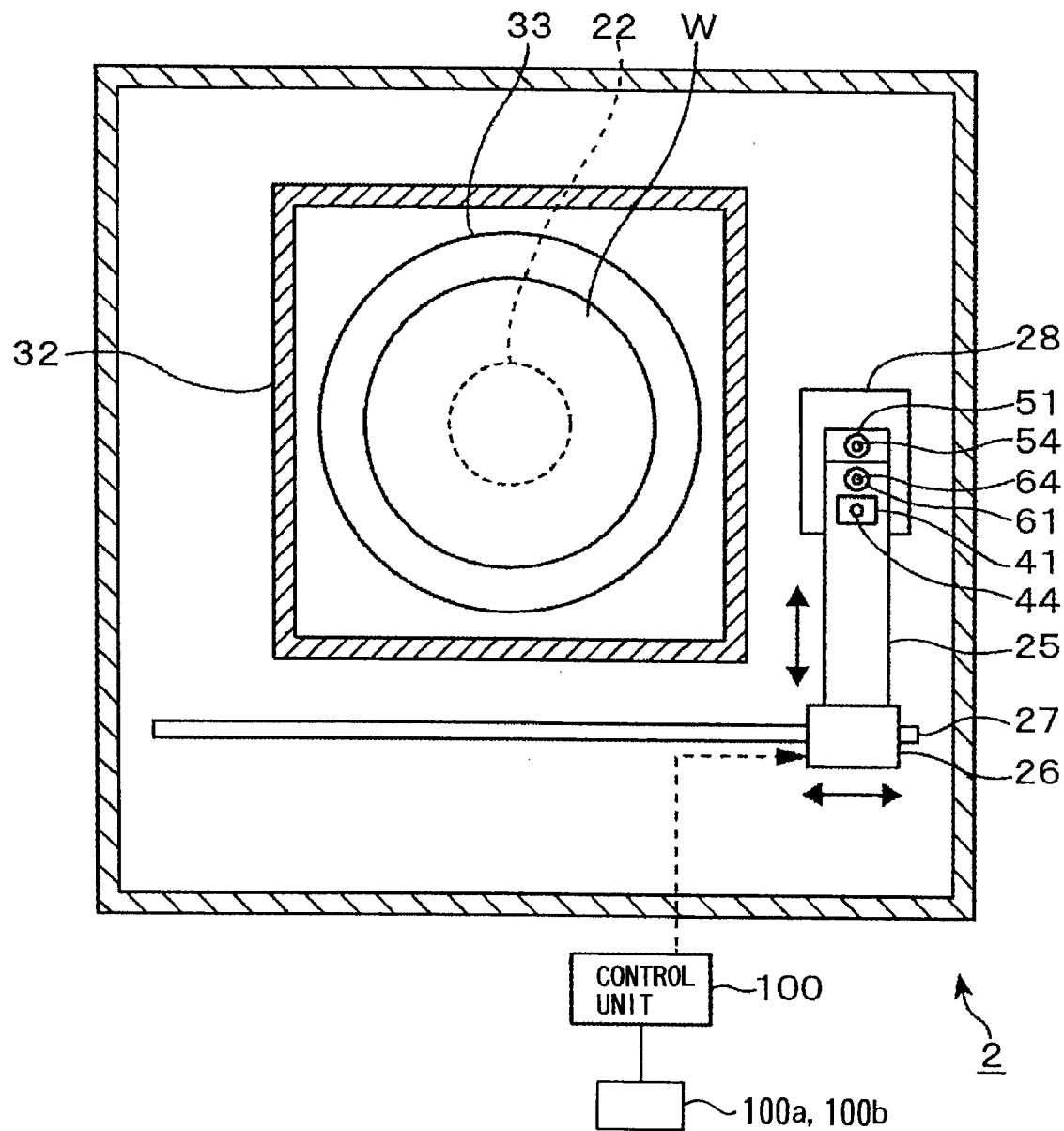
FIG. 2 is a transverse plan view of the developing apparatus shown in FIG. 1.

Now, a developing apparatus 2 according to the present invention will be described with reference to FIGS. 1 and 2. The developing apparatus 2 includes a housing 21, in which a spin chuck 22 is provided. The spin chuck is used as a substrate holding part adapted for chucking and holding, for example, a central portion of a rear face of the wafer W in a horizontal position. The spin chuck 22 is connected with a driving mechanism 24 adapted for rotating the spin chuck 22 about a rotation axis 23. The rotation axis 23 of the spin chuck 22 is positioned such that the center of the wafer W is located thereon. The spin chuck 22 is configured such that it can be rotated about a vertical axis as well as raised and lowered along a vertical axis, by the driving mechanism 24, while holding the wafer W thereon. The rotational speed of the spin chuck 22 during the developing process is controlled each time the driving mechanism 24 receives a control signal from a control unit.

A cup-like member 31 opening at its top end is provided to surround the wafer W held on the spin chuck 22. The cup-like member 31 is composed of an outer cup part 32 including a top end portion bending vertically and extending inward and a generally cylindrical side portion, and a cylindrical inner cup part 33 having an upper portion inclined inward. The outer cup part 32 can be raised and lowered by actuation of a lifting mechanism 34 connected with a bottom end of the outer cup part 32. The inner cup part 33 can also be raised and lowered via a step part that extends inward and is provided to a bottom inner circumferential face of the outer cup part 32.

A disc 35 is provided below the spin chuck 22, and a reservoir 36 having a concave cross section is provided around the whole outer periphery of the disc 35. A drain 37 is provided in a bottom face of the reservoir 36. Thus, a developing solution and/or rinsing liquid spilt down or thrown off from the wafer W and accumulated in the reservoir 36 will be discharged to the exterior of the apparatus through the drain 37. A ring member 38 having a generally triangular cross section is also provided around the disc 35. While not shown in the drawings, a plurality of lifting pins, for example, three substrate supporting pins extending through the disc 35, are also provided. With cooperation of these lifting pins and a substrate carrier mechanism (not shown), the wafer W carried into the housing 21 through a transfer port 24 formed in a side wall of the housing 21 can be transferred onto the spin chuck 22.

Figure 3:
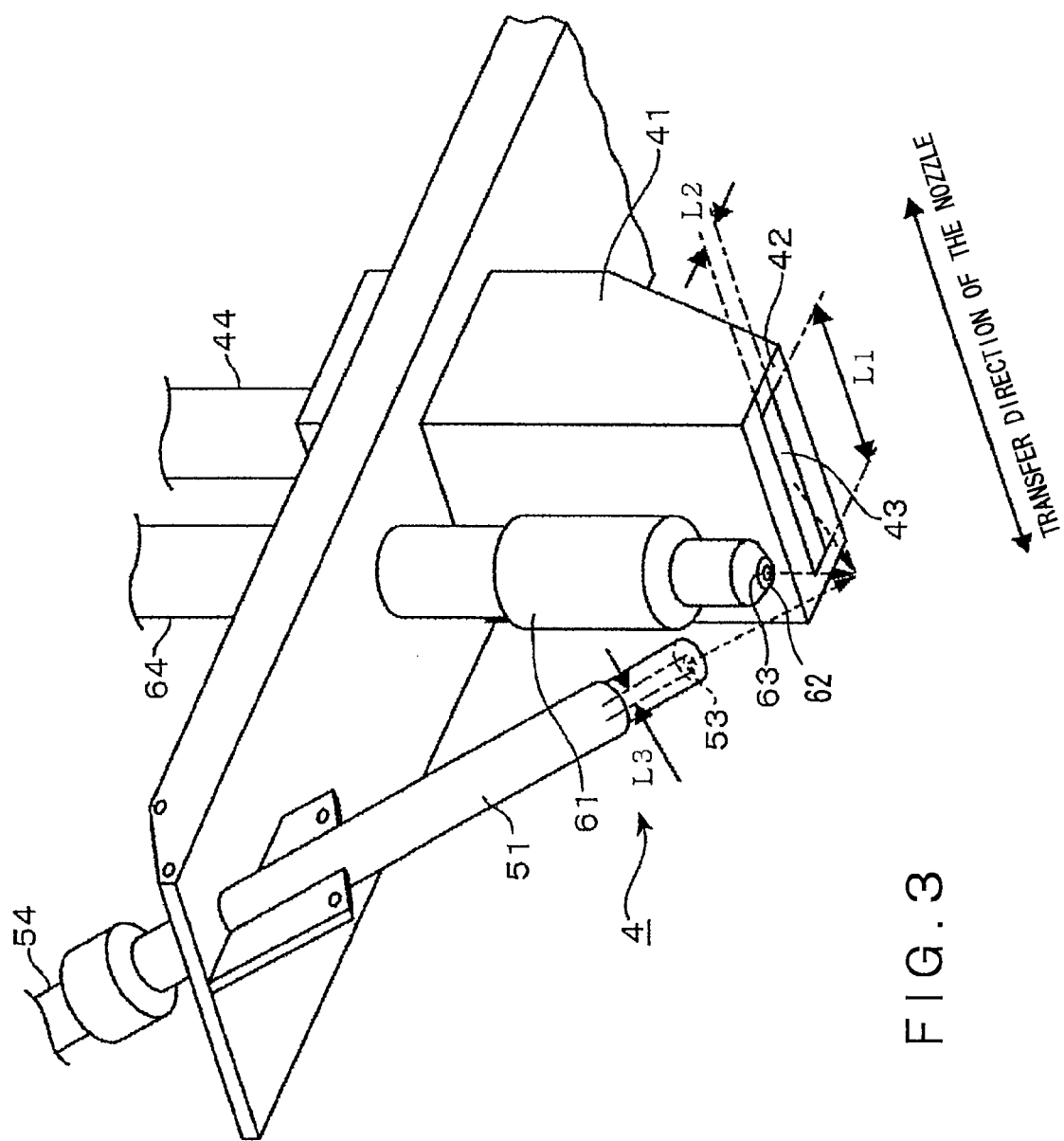
FIG. 3 is a perspective view of a composite nozzle part of the developing apparatus shown in FIG. 1.

Referring to FIG. 3, a composite nozzle part 4 provided to the developing apparatus 2 will be described. The composite nozzle part 4 is composed of a first developing solution nozzle 41, a second developing solution nozzle 51 and a pure water nozzle 61. A slit-like discharging hole 43 is provided in a bottom face 42 of the first developing solution nozzle 41, such that the developing solution can be discharged, in a ribbon-like state, therefrom, obliquely and downward, toward the wafer W held by the spin chuck 22. In this case, the discharging hole 43 discharges the developing solution, in the ribbon-like state, therefrom. Accordingly, this hole 43 may be a flat opening, for example, a flat circular opening, a flat quadrilateral opening or the like. A longitudinal direction of the discharging hole 43 is designed to extend along a line defined from a peripheral portion of the wafer W toward its central portion, with a length L1 of, for example, 5 mm to 15 mm and a width L2 of, for example, 0.1 mm to 1 mm. One end of a developing solution supply pipe 44 is connected with the first developing solution nozzle 41, and the other end of the developing solution supply pipe 44 is connected with a developing solution supply source 46 via a flow rate control part 45 composed of a valve, a mass flow controller and the like. The flow rate control part 45 controls start or stop of supply of the developing solution to the wafer W from the discharging hole 43, based on a control signal sent from a control unit 100.

Next, the second developing nozzle 51 will be described. The second developing nozzle 51 has a discharging hole 53 opening at its bottom end face. The discharging hole 53 is a generally circular fine aperture oriented obliquely and downward. While the discharging hole 53 is described herein as a circular opening or aperture, it may have a quadrilateral or triangular shape. A diameter L3 of the discharging hole 53 is, for example, 0.1 to 10 mm. One end of a developing solution supply pipe 54 is connected with the second developing solution nozzle 51, and the other end of the developing solution supply pipe 54 joins a developing solution supply source 48, via a flow rate control part 55 composed of a valve, a mass flow controller and the like, and is then connected with the developing solution supply source 46. The flow rate control part 55 controls start or stop of the supply of the developing solution to the wafer W from the discharging hole 53, based on a control signal sent from the control unit 100.

The pure water nozzle 61 has a discharging hole 63 that is a fine aperture, opening at a bottom face 62 of the pure water nozzle 61. One end of a pure water supply pipe 64 is connected with the pure water nozzle 61, and the other end of the pure water supply pipe 64 is connected with a pure water supply source 66 via a flow rate control part 65 composed of a valve, a mass flow controller and the like. The flow rate control part 65 controls start or stop of supply of the pure water to the wafer W from the discharging hole 63, based on a control signal sent from the control unit 100. In this way, the pure water is applied to the wafer W, before the developing solution is supplied thereto, and is used as a pre-wetting liquid for enhancing wettability of the developing solution. Furthermore, the pure water is supplied to the wafer W, after the supply of the developing solution thereto, and is used as the rinsing liquid for removing the developing solution.

The composite nozzle 4 is supported at one end portion of a nozzle arm 25 provided as a supporting member. The other end portion of the nozzle arm 25 is connected with a movable member 26 provided with a lifting mechanism (not shown). For example, the movable member 26 is configured to be moved along a laterally extending guide member 27, as well as driven, forward and backward, vertically to a direction in which the guide member 27 extends, after receiving a control signal from the control unit.

Figure 4:
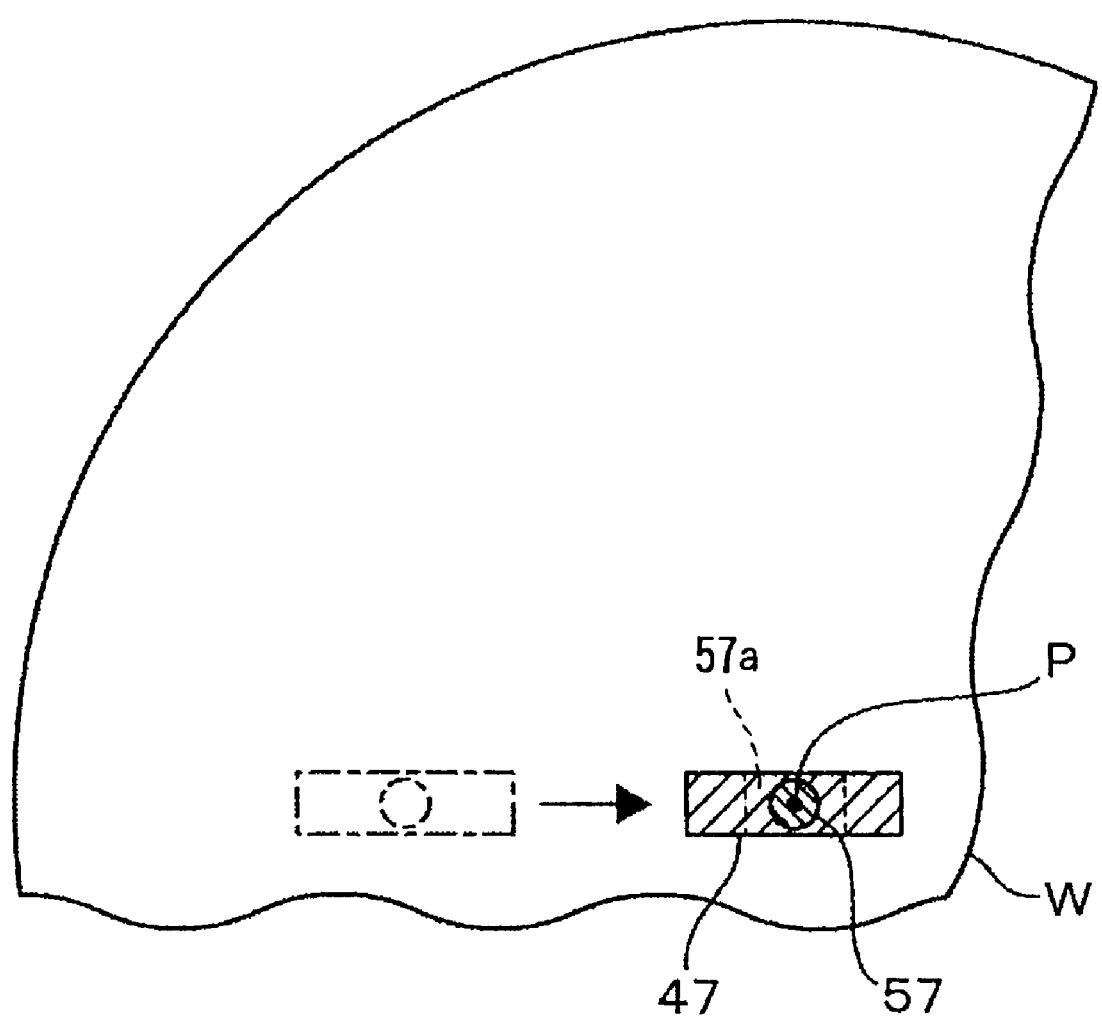
FIG. 4 is an illustration showing a manner in which a discharge region or projection of each developing solution nozzle provided to the developing apparatus shown in FIG. 1 is moved.

With such construction of the nozzle arm 25 and movable member 26 as described above, as shown in FIG. 4, one end a discharge region or projection 47 of the discharging hole 43 of the first developing solution nozzle 41 onto the wafer W placed on the spin chuck 22 is oriented toward the center P of the wafer W. In this case, when the first developing solution nozzle 41 is moved along a diametrical line of the wafer W from its peripheral portion toward the center P, the developing solution can also be supplied along the diametrical line of the wafer W. Along with this operation, the second developing solution nozzle 51 is moved from the peripheral portion of the wafer W toward the center P, such that a discharge region or projection 57 of the discharging hole 63 onto the wafer W will be overlapped on the discharge region or projection 47 of the discharging hole 43, as such the second developing solution nozzle 51 can also supply the developing solution to the center P. While not shown in the drawings, a discharge region or projection of the discharging hole 63 of the pure water nozzle 61 onto the wafer W is also moved, while being overlapped on the discharge region or projection 57 of the discharging hole 53 of the second developing solution nozzle 51 onto the wafer W. Thus, the pure water can also be supplied to the center P of the wafer W from the discharging hole 63.

The developing solution supplied from the discharging hole 43 of the first developing solution nozzle 41 will form a ribbon-like liquid region on the surface of the wafer W. This ribbon-like region substantially corresponds to the discharge region or projection 47 of the discharging hole 43 onto the wafer W, as such it can also be designated by the same reference numeral 47. Similarly, a circular region of the developing solution supplied from the discharging hole 53 of the second developing solution nozzle 51 substantially corresponds to the discharge region or projection 57 of the discharging hole 53 onto the wafer W, thus it can also be designated by the same reference numeral 57.

As used herein, the "discharge region" means a region that will be formed, on the wafer W, from the liquid discharged from each nozzle located at any point, and the "projection" means a projection, of each nozzle located at any point, that will be created on the wafer W when the wafer is irradiated with light coming, via the nozzle, along each longitudinal direction of the nozzle. Therefore, these two expressions have substantially the same meaning and are interchangeably used herein.

When the liquids are discharged, respectively, from the discharging hole 43 of the first developing solution nozzle 41, discharging hole 53 of the second developing hole 51 and discharging hole 63 of the pure water nozzle 61, the height of these discharging holes 43, 53, 63 from the surface of the wafer W will be, for example, 5 mm to 20 mm, respectively. Reference numeral 28 in FIG. 2 designates a waiting section for the composite nozzle part 4, the waiting section being located outside the outer cup part 32.

Next, the control unit 100 will be described. The control unit 100 is composed of, for example, a computer, and includes a program storage part 100*a*. In this program storage part 100*a*, a program, such as a software program, is stored, in which instructions are incorporated or provided such that the developing process can be performed in the operation as will be discussed later. The control unit 100 reads this program in order to control the rotational speed of the wafer, transfer of each nozzle and supply of the developing solution and/or pure water to the wafer. This program is stored in the program storage part, while being saved in a storage medium 100*b*, such as a hard disc, compact disc, magnet optical disc or memory card.

Figure 5:
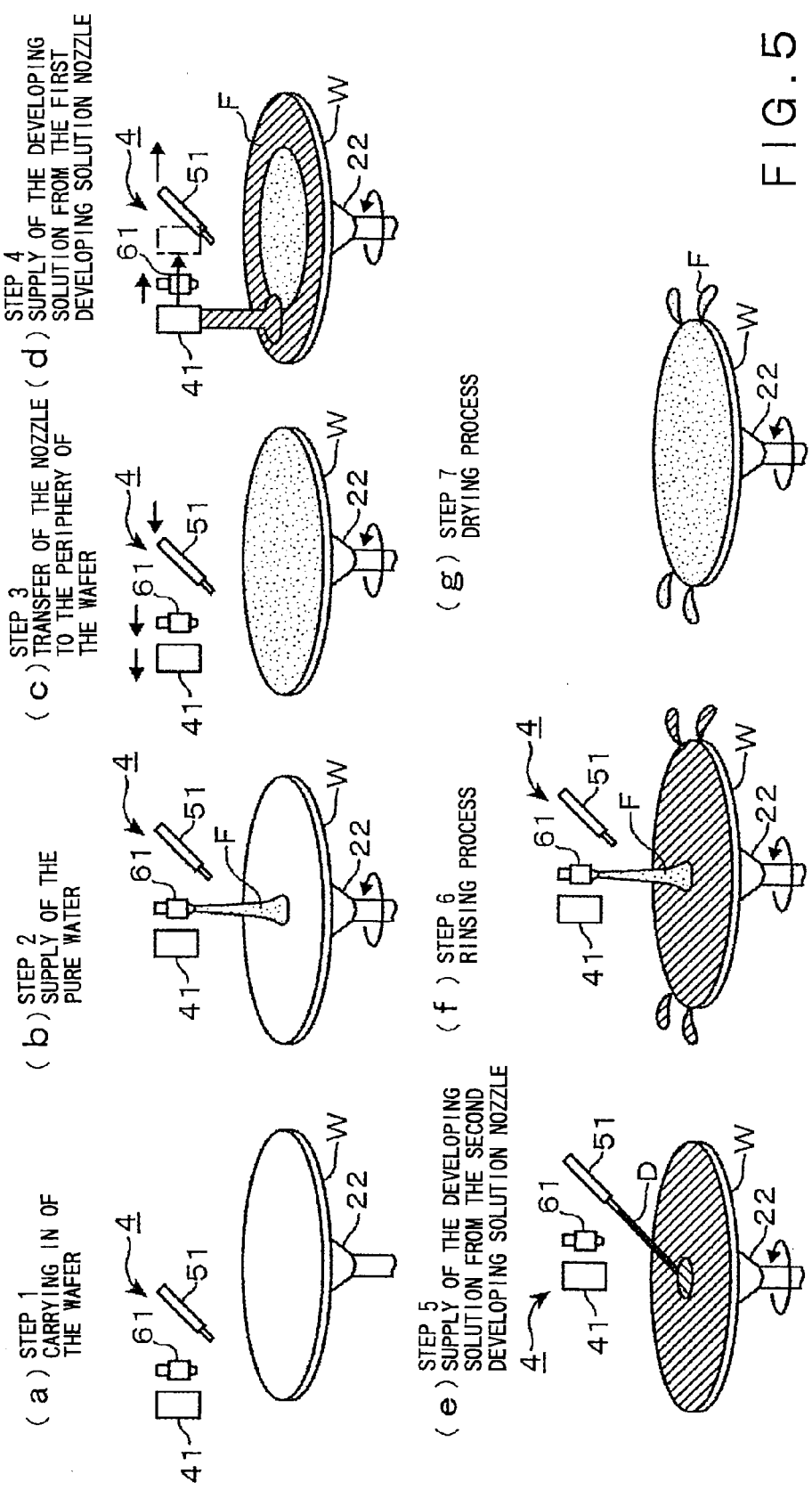
FIGS. 5(a) to 5(g) are illustrations each showing each step of a developing process performed by the developing process shown in FIG. 1.
Figure 6:
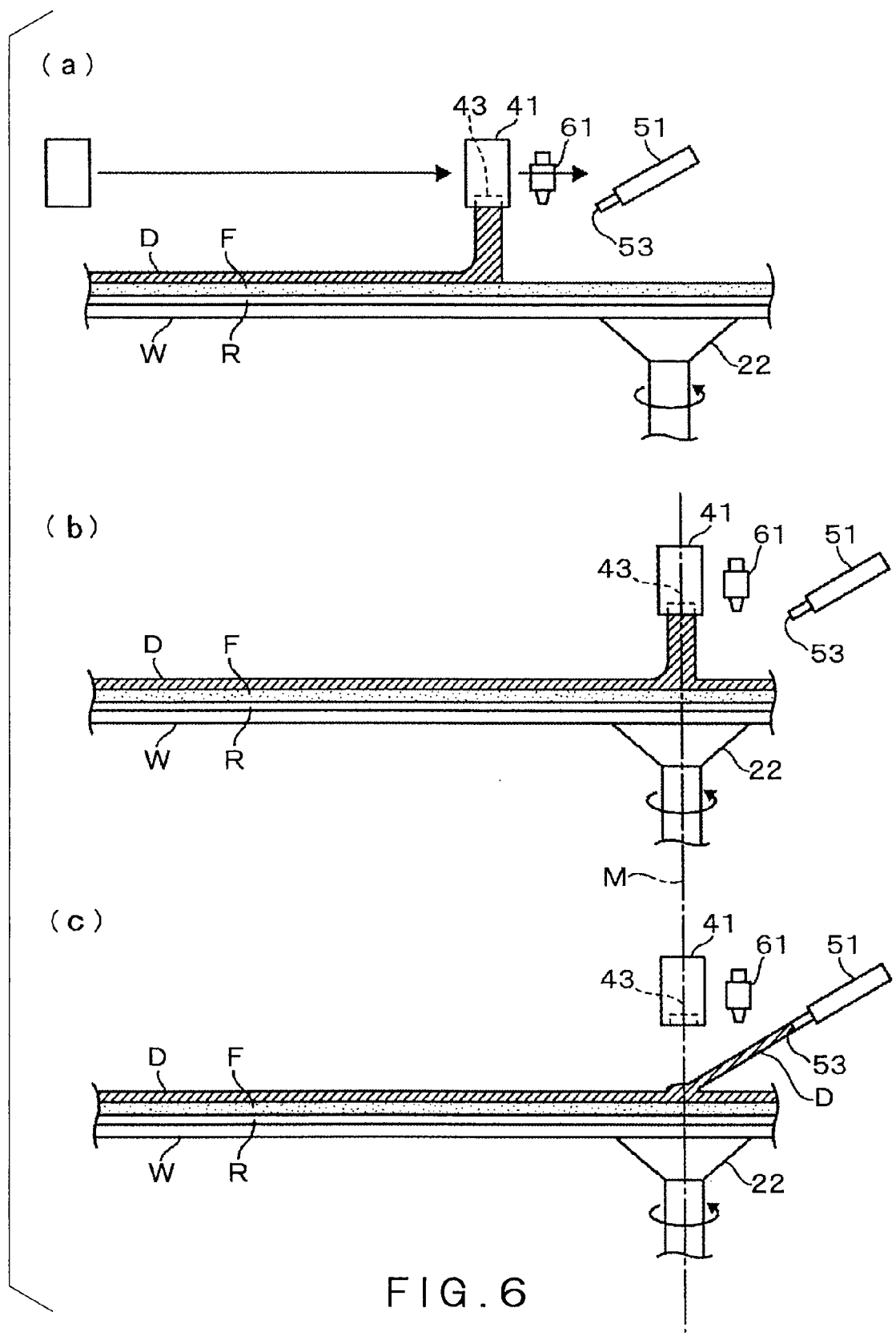
FIGS. 6(a) to 6(c) are illustrations each showing a manner in which a developing solution is supplied onto the wafer W in the developing process.

Next, a procedure for providing the developing step comprising a series of steps, to the wafer W, by using the developing apparatus 2, will be described with reference to FIGS. 5 and 6. FIGS. 5 and 6 show each step and a state of the surface of the wafer W processed by each step, respectively. In FIGS. 5 and 6, for convenience and better understanding, each nozzle 41, 51 and 61 is arranged in a line along the longitudinal direction of the discharging hole 43 of the nozzle 41, unlike those depicted in FIG. 1 and the like, such that they are not overlapped one on another.

(Step 1: Carrying in of the Wafer W)

First, a resist R is applied to the surface of the wafer W, by using a substrate carrier means (not shown). When the wafer W coated with the resist R that has been subjected to an exposure process is carried in the housing 21 through the transfer port 24, the wafer W is transferred onto the spin chuck 22 due to the cooperation of the substrate carrier means and the lifting pins (not shown). Then, the outer cup part 32 and inner cup part 33 are located at elevated positions, respectively. Subsequently, the spin chuck is rotate at 1100 to 1500 rpm, for example, 1500 rpm, and the composite nozzle part 4 is moved, by the movable member 26, to a position above the wafer W from the waiting position 28, until the pure water nozzle 61 of the composite nozzle part 4 is located in a position over the center of the wafer W (FIG. 5(*a*)).

(Step 2: Supply of the Pure Water)

Once the pure water nozzle 61 is moved to the position over the central portion of the wafer W, pure water F is discharged toward the central portion of the wafer W from the pure water nozzle 61. In this case, the discharged pure water F will be spread, by centrifugal force, i.e., spin coating, from the central portion of the wafer W to its periphery, thereby performing a pre-wetting process for forming a liquid film of the pure water F (FIG. 5(*b*)).

(Step 3: Transfer of the Developing Solution Nozzle)

After a period of time later than the start of discharge of the pure water F, the discharge of the pure water F from the pure water nozzle 61 is stopped, and the composite nozzle part 4 is then moved outward from the position above the central portion of the wafer W. Consequently, the first developing solution nozzle 41 will be moved to a position, which is slightly inside from the outer circumference of the wafer W and is higher than the wafer W, by, for example, approximately 15 mm (FIG. 5(c)).

(Step 4: Supply of the Developing Solution from the First Developing Solution Nozzle)

Thereafter, the rotational speed of the wafer W will be changed into, for example, 1000 rpm to 1500 rpm. A developing solution D is then discharged, at a predetermined flow rate of approximately 100 ml/min to 1000 ml/min, for example, 600 ml/min, from the discharging hole 43 of the first developing solution nozzle 41, so as to form the ribbon-like region on the wafer surface. While forming such a ribbon-like liquid region, the first developing solution nozzle 41 is moved from the peripheral portion of the wafer W toward the central portion thereof, in the radial direction, over the horizontally flat surface, as shown in FIG. 5(d). In this way, the developing solution D will be supplied, in a spiral state, onto the wafer W, while outwardly spreading and wetting over the surface of the pure water F, due to the centrifugal force of the rotating wafer W (FIG. 6(a)).

(Step 5: Supply of the Developing Solution from the Second Developing Solution Nozzle)

Figure 7:
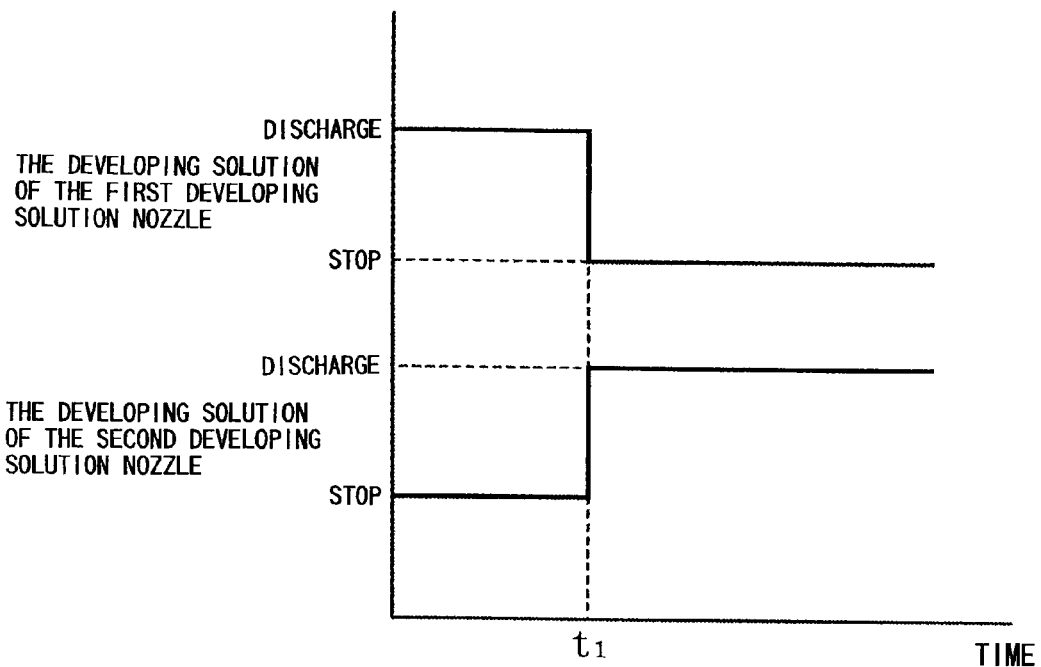
FIG. 7 is a timing chart showing timing for starting and stopping the discharge of the developing solution from each developing solution nozzle.

The first developing solution nozzle 41 continues to move toward the central portion of the wafer W until the discharge region of the discharging hole 43 onto the wafer W reaches a central axis M as shown by a dotted line in FIG. 6(b). Once the first developing solution nozzle 41 reaches the central axis M and the liquid film of the developing solution D is formed over the whole surface of the wafer W, due to the supply of the developing solution D up to the central portion of the wafer W by the nozzle 41, the second developing solution nozzle 51 is oriented such that the discharge region of the discharging hole 53 onto the wafer W corresponds to the central axis M depicted by the dotted line in the drawing. As shown in a time chart of FIG. 7, at the same time the supply of the developing solution D from the discharge hole 43 of the first developing solution nozzle 41 is stopped, the developing solution D is supplied from the discharge hole 53 of the second developing solution nozzle 51, at a flow rate of 100 ml/min to 1000 ml/min (FIG. 5(e)). During the supply of the developing solution from the second developing solution nozzle 51, the wafer W is rotated at a speed of, for example, 500 rpm to 1500 rpm, and the developing solution D supplied from the second developing solution nozzle 51 will be spread, by the centrifugal force, toward the periphery of the wafer W over the liquid surface of the developing solution D already formed on the wafer W (FIG. 6(c)).

(Step 6: Rinsing Process)

After a period of time, for example, 10 to 20 seconds, later than the start of discharge of the developing solution D from the second developing solution nozzle 51, the discharge of the developing solution D from the second developing solution nozzle 51 is stopped. Then, the pure water nozzle 61 will be immediately moved to the position above the central portion of the wafer W and discharge the pure water F, before the developing solution D on the wafer W is dried up. The discharged water F will be spread outward over the wafer surface, due to the centrifugal force of the rotating wafer W, washing away the developing solution containing dissolved components of the resist on the wafer surface, thereby washing and cleaning the surface of the wafer W (FIG. 5(f)).

(Step 7: Drying Process)

After a period of time later than the start of discharge of the pure water F, the discharge of the pure water F is stopped, and the composite nozzle part 4 is then moved to the waiting position 28. Subsequently, the wafer W is rotated at a speed of, for example, 2000 rpm, in order to throw off the liquid on the wafer surface, in a spinning drying process (FIG. 5(g)). Thereafter, the rotation of the wafer W is stopped, and the outer cup part 32 and inner cup part 33 are lowered. Then, the wafer W is carried out by the substrate carrier mechanism (not shown), as such ending the developing process.

According to the developing apparatus 2 described above, the first developing solution nozzle 41 adapted for supplying the developing solution, such that the ribbon-like region of the developing solution can be formed on the wafer W, and the second developing solution nozzle 51 adapted for supplying the developing solution, such that the circular region of the developing solution narrower or smaller than the ribbon-like region can be formed on the wafer W, are provided. In this way, the liquid film of the developing solution can be first formed on the wafer surface, due to the first developing solution nozzle 41 adapted for supplying the developing solution onto the wafer W while moving from the peripheral portion of the wafer W toward the central portion thereof. Then, after the formation of the liquid film, the developing solution can be further supplied to the center of the wafer W from the second developing solution nozzle 51, in order to prevent the liquid film formed by the first developing solution nozzle 41 from being dried up. With such selection of the nozzles for discharging the developing solution, corresponding to the flow rate of the developing solution to be supplied onto the wafer W, the flow rate of the developing solution supplied from the second developing solution nozzle 51 can be significantly reduced. As compared with the prior art for additionally supplying the developing solution in order to prevent the drying of the already formed liquid film of the developing solution, the discharge of the developing solution can be stabilized, thereby suppressing occurrence of the developing defect. Furthermore, with the significant reduction of the flow rate of the developing solution supplied from the second developing solution nozzle 51 as compared with the flow rate due to the first developing solution nozzle 41, the amount of the developing solution to be supplied onto the wafer W can be significantly reduced, thereby suppressing elevation of cost for the developing process.

The discharging hole 43 is not limited to such a slit-like shape as shown and described herein. For example, another discharging hole having a configuration such that a plurality of circular holes are arranged therein along the transfer direction of the first developing solution nozzle 41 may be used, provided that the developing solution can be supplied, eventually, in a ribbon-like state, from the first developing solution nozzle 41. Alternatively, the discharging hole 43 may be formed into an elliptical shape having the major axis extending along the longitudinal direction of the nozzle. Otherwise, it may be formed into a rhombus-like shape having one diagonal line extending along the longitudinal direction of the nozzle. In addition, the shape of the discharging hole 53 is not limited to such a generally circular shape as described above. Namely, another shape than the circular shape may be used without departing from the scope of this invention, provided that the developing solution can be stably supplied onto the wafer W from the discharging hole 53 of the second developing solution nozzle 53. For instance, the discharging hole 53 may be formed into a slit-like shape having a longitudinal length less than the longitudinal length of the discharging hole 43, in order to supply the developing solution, in a slit-like shape, onto the wafer W. Alternatively, the discharging hole 53 may be a true circle. Furthermore, the shape of the discharge region or projection of the discharging hole 53 onto the wafer W may not be a circular shape or rectangular shape. Alternatively or additionally, the second developing solution nozzle 51 may include a plurality of discharging holes. It should be noted that in the case in which the developing solution supplied from the discharging hole 53 of the second developing solution nozzle 51 forms a ribbon-like region 57$a$, such a ribbon-like region 57$a$ formed from the developing solution supplied from the second developing solution nozzle 51 is shorter in length than the ribbon-like region 47 formed by the developing solution supplied from the first developing solution nozzle 41 (see FIG. 4).

Figure 8:
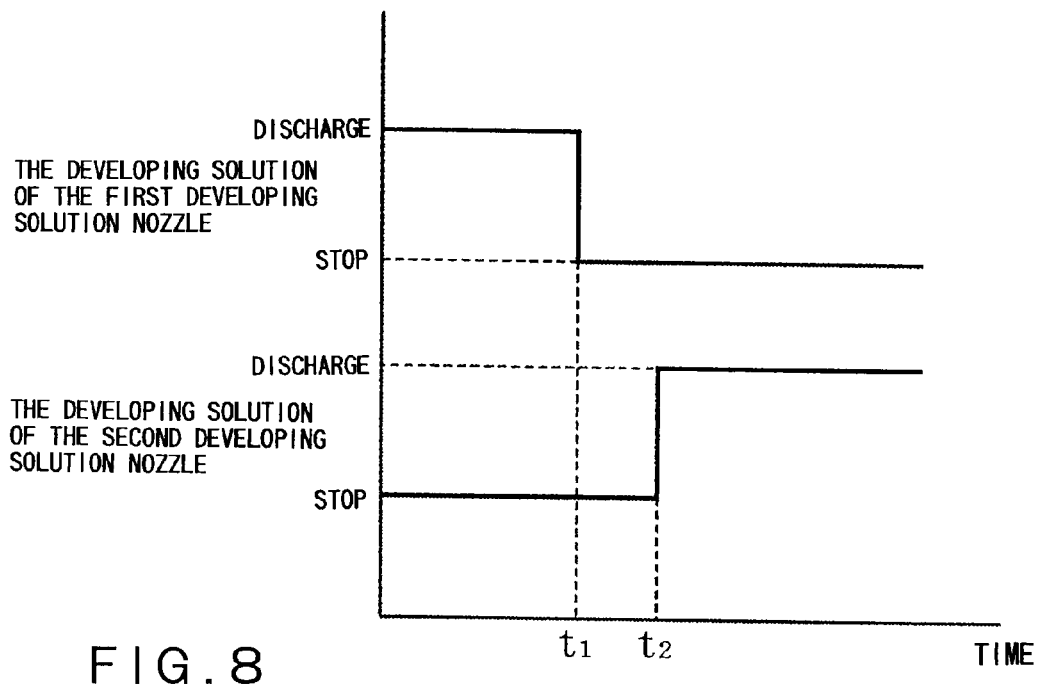
FIG. 8 is a timing chart showing another example of the timing for starting and stopping the discharge of the developing solution.

In the above embodiment, the timing of supplying the developing solution from the second developing solution nozzle 51 should be set before the developing solution supplied onto the wafer W from the first developing solution nozzle 41 is dried up. As shown in FIG. 8, some shift or interval may be set between a time to at which the supply of the first developing solution is stopped and a time t2 at which the supply of the second developing solution is started. For example, the shift between the time to and the time t2 is 2 seconds or less.

Figure 9:
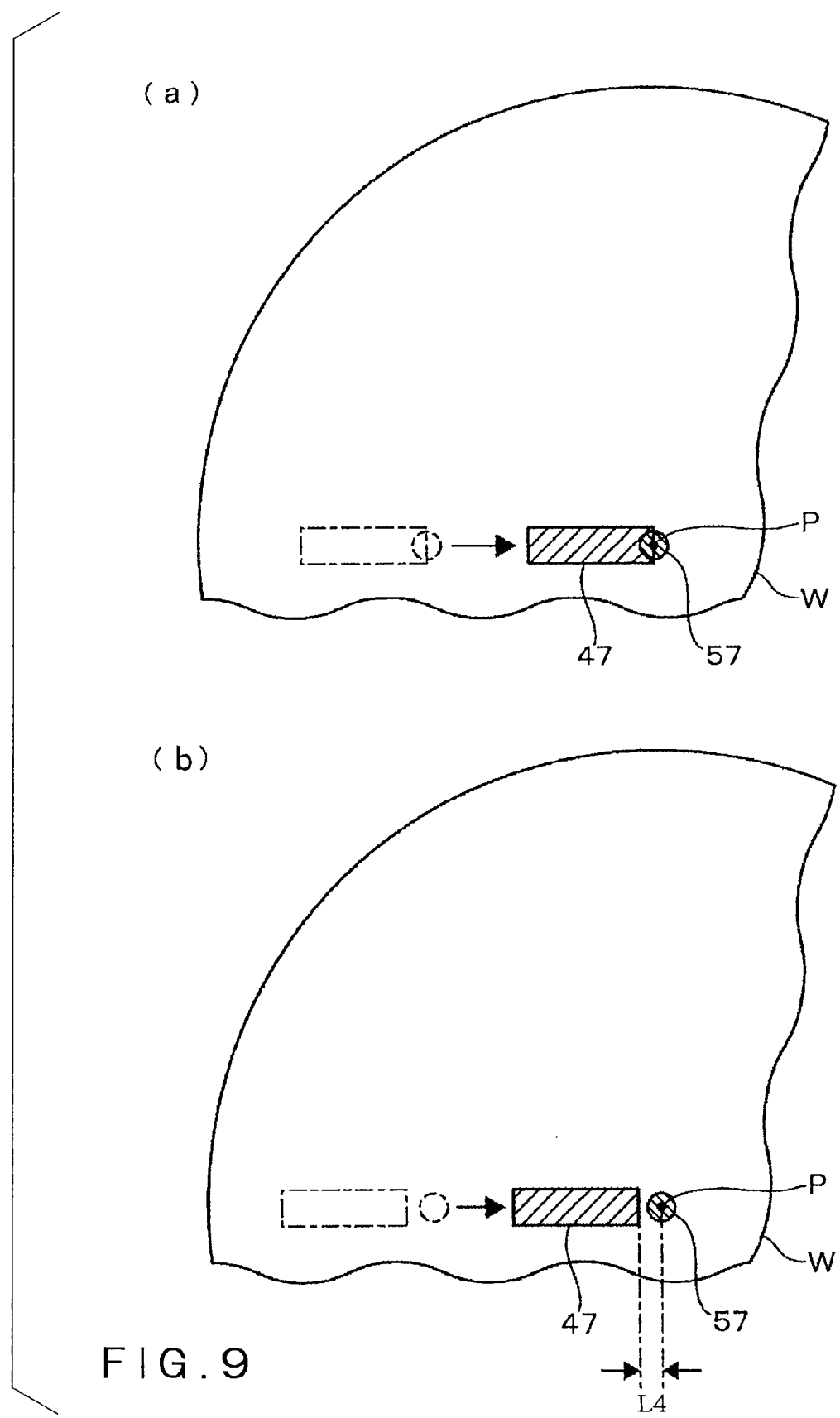
FIGS. 9 (a) and 9(b) are illustrations each showing a positional relationship between the discharge region of each developing solution nozzle and a center of the wafer W.

In the above embodiment, while the first developing solution nozzle 41 is moved to the position in which the center P of the wafer W is included in the discharge region 47 of the discharging hole 43, the nozzle 41 may be moved such that the discharge region 47 is in contact with the center P of the wafer W, as shown in FIG. 9($a$), for example. Alternatively, as shown in FIG. 9($b$), the movement of the first developing solution nozzle 41 may be stopped before the discharge region 47 reaches or contacts with the center P of the wafer W, provided that wetting and spreading of the developing solution over the wafer W permits the supply of the developing solution onto the center P of the wafer W. In this case, a distance L4 between a forward end of the discharge region 47 and the center P when the movement of the first developing solution nozzle 41 is stopped may be 10 mm or less. With such construction, unduly overlapped coating of the developing solution at the central portion of the wafer W can be controlled adequately, thus significantly reducing the amount of the developing solution to be used. As with the first developing solution nozzle 4, the second developing solution nozzle 51 may also be stopped before the discharge region 57 of the second developing solution nozzle 51 includes or contacts with the center P of the wafer W, provided that the wetting and spreading of the developing solution over the wafer W permits the supply of the developing solution onto the center P of the wafer W.

In the case of supplying the developing solution onto the wafer W by using the first developing solution nozzle 41, each adjacent ribbon-like portion formed from the discharged developing solution may be overlapped one on another, or coated without any space, or otherwise arranged with a slight space relative to one another, provided that the spreading of the developing solution supplied onto the wafer can form an adequate liquid film of the developing solution over the whole surface of the wafer W. It is also contemplated that, in the step 4, the first developing solution nozzle 41 may be first moved from the central portion toward the peripheral portion of the wafer W so as to form the liquid film of the developing solution thereon, and the second developing nozzle 42 may then be moved to the center of the wafer W in order to supply the developing solution to the center of the wafer W before the first developing solution is dried up. In the above embodiment, the pure water is supplied onto the wafer W prior to the supply of the developing solution. Doing so can enhance the wettability of the developing solution, as such the developing solution can be spread over the whole surface of the wafer W even when the amount of the developing solution is significantly reduced.

Alternatively, after the supply of the pure water onto the wafer W as described above, the developing solution may be supplied to the center of the wafer W by using the first developing solution nozzle 41 or second developing solution nozzle 51, then the developing solution may be spread toward the periphery of the wafer W due to the spin coating. Thereafter, in order to perform the step 4, the first developing solution nozzle 41 may be moved from the peripheral portion to the central portion of the wafer W while supplying the developing solution thereon, thereby forming the liquid film of the developing solution over the wafer W. In this case, since the pure water is repelled due to a water-repellent property of the resist, the developing solution first supplied onto the center of the wafer W after the supply of the pure water can be spread throughout the wafer surface. As such, the wettability of the developing solution onto the wafer W can be enhanced. Therefore, in the case of supplying the developing solution from the peripheral portion up to the central portion of the wafer W in order to perform the step 4, the developing solution can adequately wet and spread over the wafer surface. Accordingly, the developing defect can be suppressed, thereby enhancing the uniformity of the resist pattern. Namely, in this case, the supply of the pure water is used for a first pre-wetting process, and the subsequent supply of the developing solution is used for a second pre-wetting process.

Each discharge region of the discharging holes 43, 53, 63 of the nozzles 41, 51, 61 is not limited to a situation in which it is overlapped one on another. For instance, each discharge region of the discharging holes 43, 53, 63 of the nozzles 41, 51, 61 may be shifted onto the center of the wafer W, in succession, by the forward and backward movement (vertical to the direction in which the guide member 27 extends) of the nozzle arm 25, due to actuation of the movable member 26.

Figure 10:
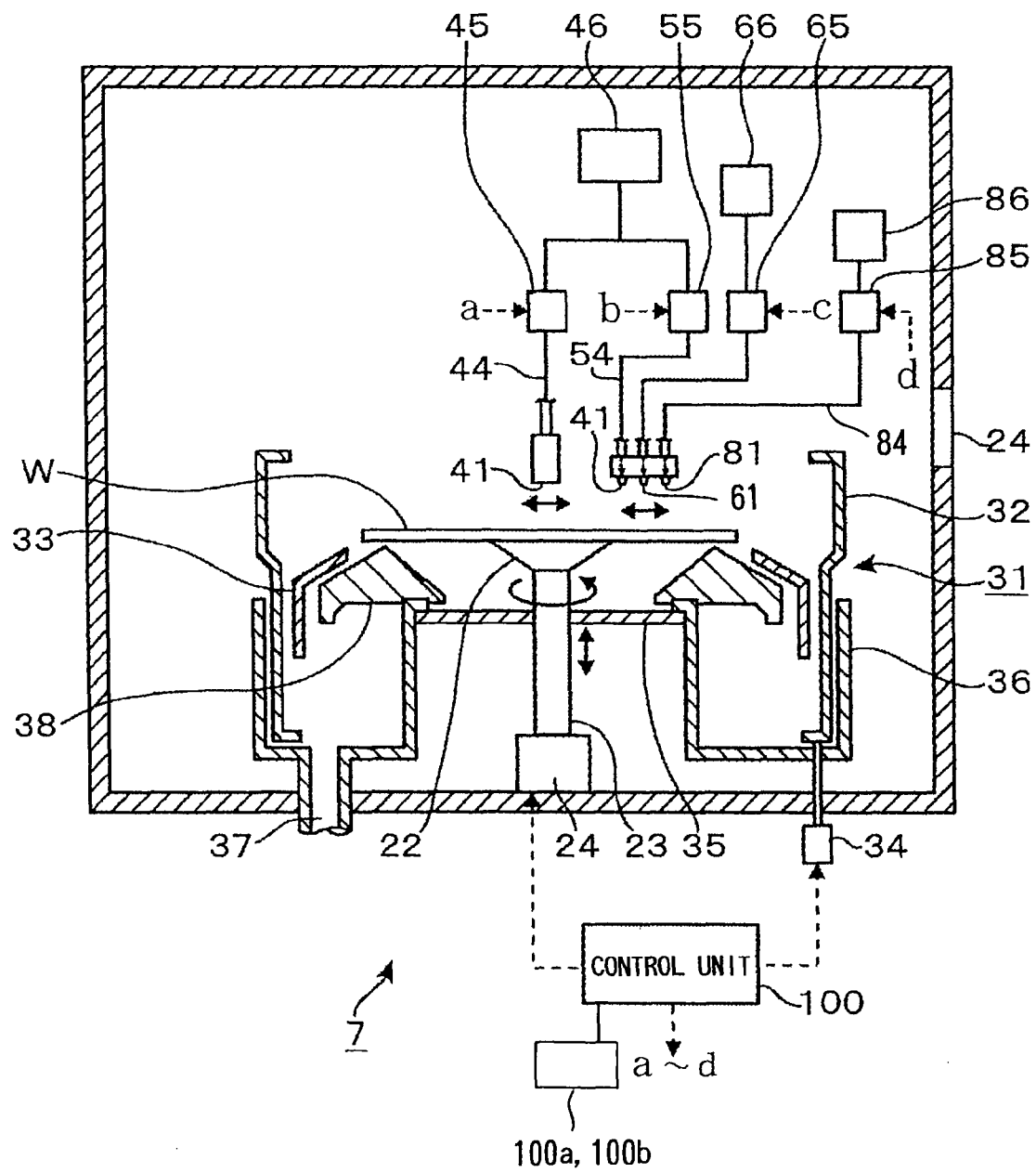
FIG. 10 is a longitudinal side cross section of the developing apparatus related to another embodiment of the present invention.
Figure 11:
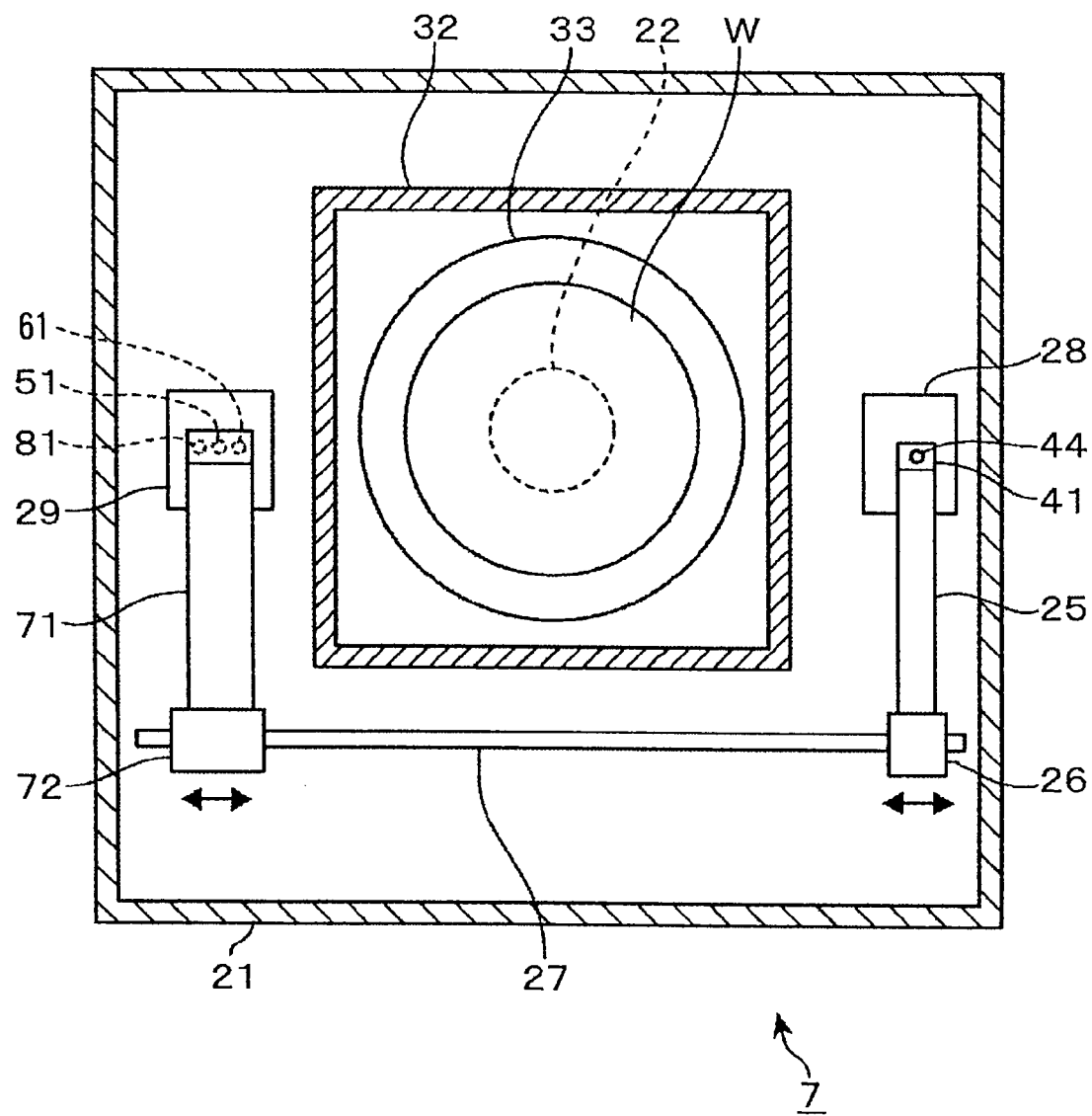
FIG. 11 is a transverse plan view of the developing apparatus shown in FIG. 10.

FIGS. 10 and 11 are a longitudinal side cross section and a transverse plan view, respectively showing a developing apparatus 7 which is an alteration of the developing apparatus 2. The developing apparatus 7 includes another nozzle arm 71, in addition to the nozzle arm 25. The first developing solution nozzle 41 is provided at one end of the nozzle arm 25, while the second developing solution nozzle 51 and pure water nozzle 61 and an N2 gas nozzle 81 are provided to one end of the nozzle arm 71. Each arm 25, 71 is configured to be moved, independently, along the guide member 27, due to actuation of each movable member 26, 72 provided to the other end of each arm. In addition, each arm 25, 71 can be raised and lowered, independently, by each lifting mechanism (not shown). The N2 gas nozzle 81 is connected with an N2 gas supply source 86 via a gas supply pipe 84. Reference numeral 85 designates a flow rate control part adapted for controlling start or stop of supply of N2 gas from the N2 gas nozzle 81 to the wafer W, based on a control signal sent from the control unit 100. Each nozzle 51, 61, 81 provided to the nozzle arm 71 can be moved onto the center of the wafer W, in order to supply the liquid or gas onto the center, respectively. In the drawing, reference numeral 29 is a waiting position for the nozzles 51, 61 and 81.

The developing apparatus 7 can provide the developing process to the wafer W in the same procedure as with the developing apparatus 2, and provide the same effect as that obtained by the developing apparatus 2. However, the drying step for the wafer W in the aforementioned step 7 is performed by supplying the N2 gas, or an inert gas that does not chemically react with the resist, to the central portion from the N2 gas nozzle 81, while rotating the wafer W as described above. In this way, a current of the gas flowing from the center of the wafer W toward its periphery can be created, due to evacuation provided in the cup part 31 as well as to the gas supply, as such reducing the time required for drying the wafer W. It should be appreciated that the developing apparatus 2 may also includes an inert gas supply nozzle, such as the N2 gas nozzle 81.

Figure 12:
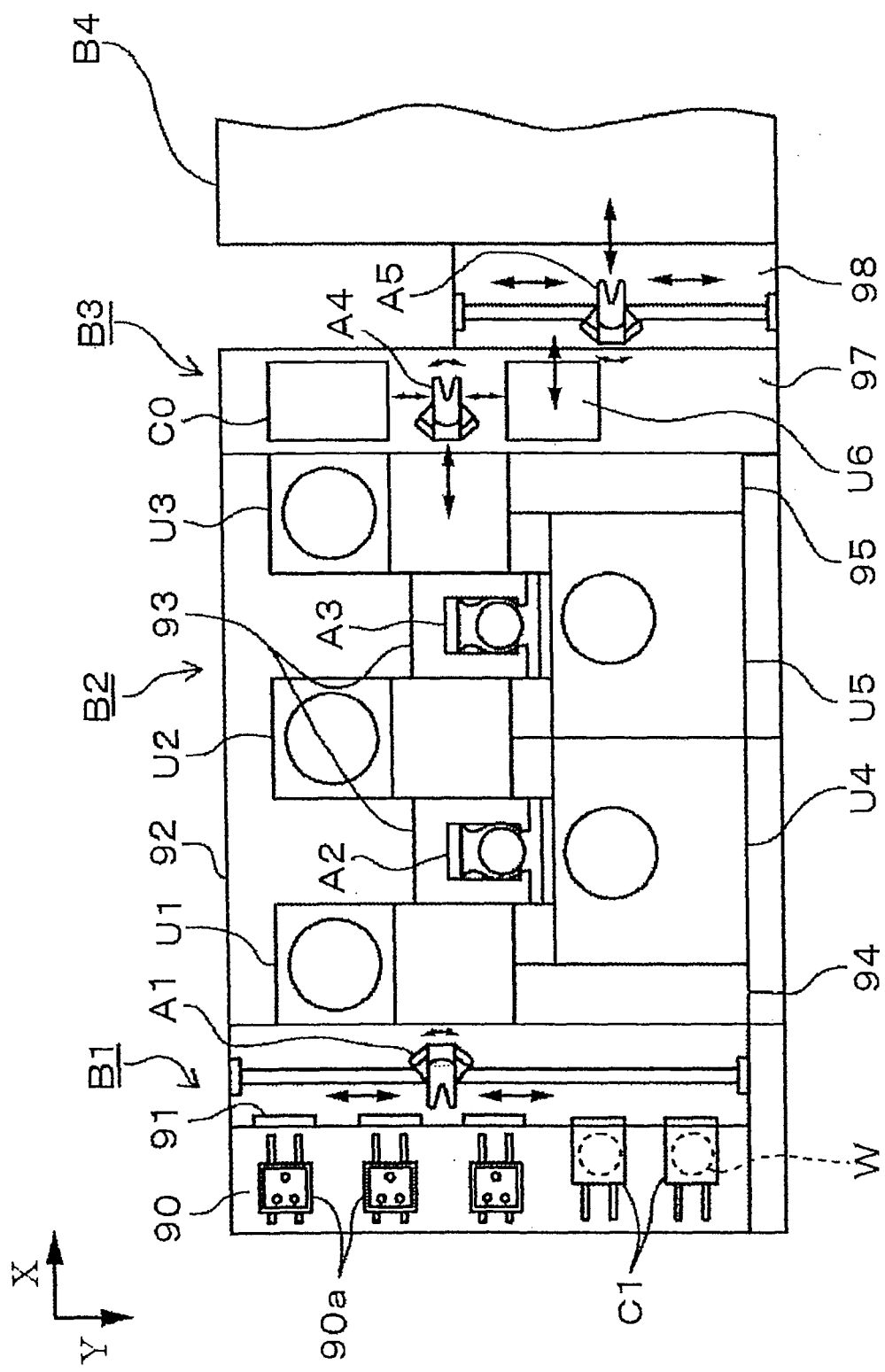
FIG. 12 is a top view of a coating and developing apparatus to which the developing apparatus of this invention is applied.

Next, one example of a coating and developing apparatus, in which the aforementioned developing apparatus 2 is incorporated, will be described in brief with reference to FIGS. 12 and 13. In the drawings, reference character B1 designates a carrier block adapted for carrying in and carrying out each carrier C1, in which, for example, 25 sheets, of wafers W or substrates are contained in a hermetically sealed state. Specifically, the carrier block B1 is provided with a carrier station 90 including placing tables 90a respectively adapted for placing a plurality of carriers C1 thereon, opening and closing parts 91 each provided in a forward wall when seen from the carrier station 90, and a transfer means A1 adapted for taking out the wafer W from each carrier C1 via the corresponding opening and closing part 91.

On a backside of the carrier block B1, a processing block B2 surrounded by a housing 92 is located, while being connected with the carrier block B1. In the processing block B2, rack units U1, U2, U3 and main carrier means A2, A3 are arranged, in this order, from the front side, alternately, relative to one another. In each rack unit U1, U2, U3, heating and cooling units are stacked in a multi-stage fashion. Each main carrier means A2, A3 is adapted for transferring the wafer W between processing units including coating and developing units as will be described later. Namely, the rack units U1, U2, U3 and main carrier means A2, A3 are arranged, in a line, from the front side to the back side, when seen from the carrier block B1, with a wafer transferring opening (not shown) provided at each connection point there between. In this way, each wafer W can be optionally transferred from the rack unit U1 provided at one end portion of the processing block B2 up to the rack unit U3 provided at the other end portion of the processing block B2. Each main carrier means A2, A3 is located in a space defined by walls 93. When seen from the carrier block B1, each space defined by the walls 93 includes two walls respectively arranged on the front and back sides and extending along a front and back wall of each corresponding rack unit U1, U2, U3, a right side wall extending along liquid processing unit U4, U5 as will be described later, and a left side or rear wall. In the drawings, reference numerals 94, 95 respectively designate temperature-humidity control units, each including a temperature control system provided for each processing liquid used in each unit, and a duct for temperature-humidity control and the like.

Figure 13:
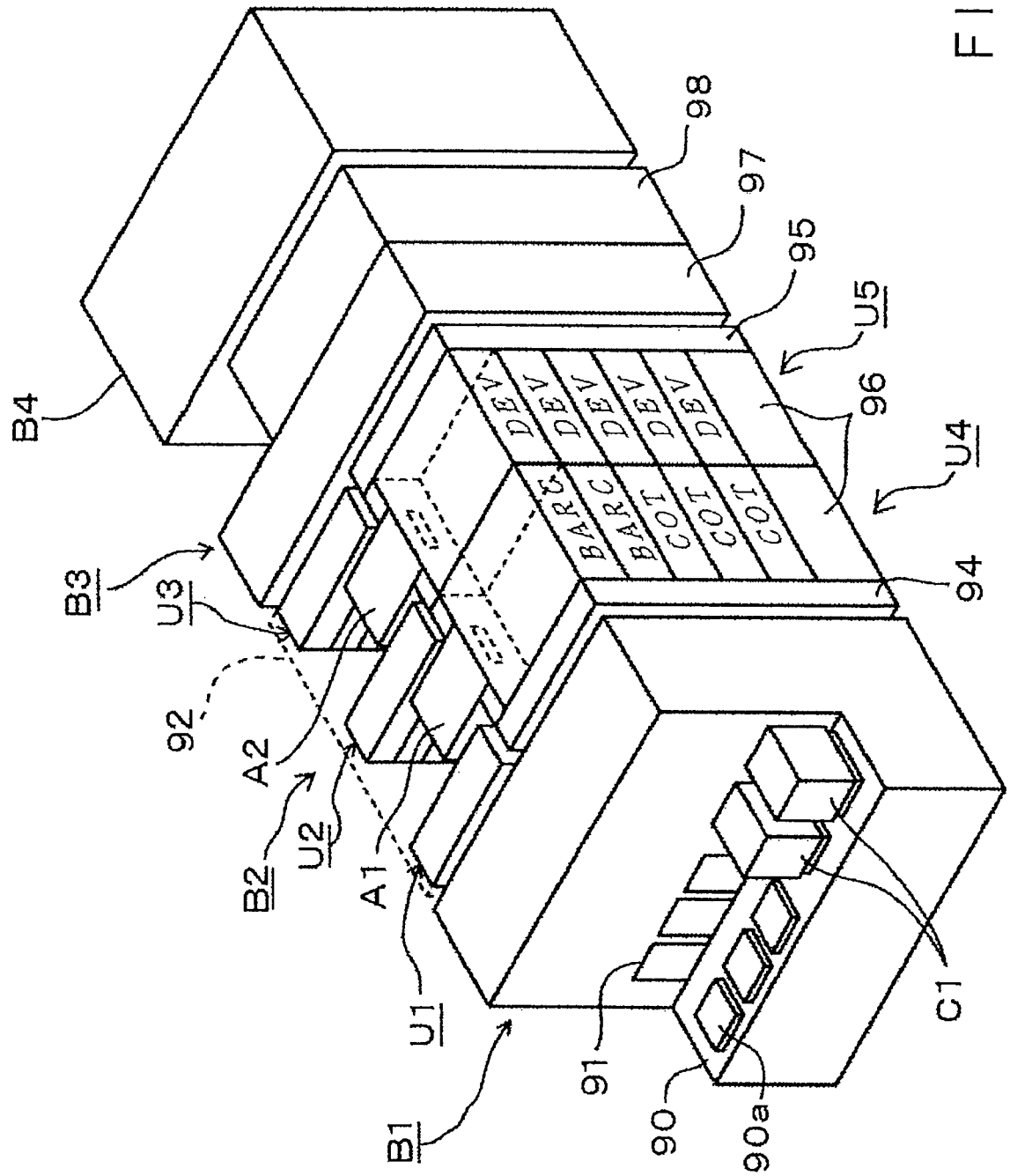
FIG. 13 is a perspective view of the coating and developing apparatus shown in FIG. 12.

For example, as shown in FIG. 13, each liquid processing unit U4, U5 is composed of coating units COT, developing units DEV each corresponding to the developing apparatus 2 related to the present invention, and antireflection film forming units BARC, wherein these units are stacked, in a plurality of, for example, five, stages, on a storage part 96 defining a space for supplying chemical liquids, such as a coating liquid (resist liquid) and/or developing solution. Each rack unit U1, U2, U3 is composed of various kinds of units each adapted for performing a pre-treatment and/or post-treatment for the process performed in each liquid processing unit U4, U5, wherein these units are stacked, in a plurality of, for example, ten, stages and include baking units for baking the wafer W, cooling units for cooling the wafer W and the like, respectively.

On a further back side of the rack unit U3 of the processing block B2, an exposure apparatus B4 adapted for performing a dipping exposure process is located, via an interface block B3 composed of, for example, a first carrier chamber 97 and a second carrier chamber 98. In the interface block B3, two transferring means A4, A5 and a rack unit U6, each adapted for transferring each wafer W between the processing block B2 and the exposure apparatus B4, are provided.

Now, one example of a flow or transfer of each wafer in this apparatus will be described. First, once the carrier C1, in which the wafer W is externally contained, is placed on the corresponding placing table 90a, the opening and closing part 91 as well as a cover of the carrier C1 will be opened, as such the wafer W can be taken out by the transferring means A1. Thereafter, the wafer W is transferred to the main carrier means A3 via a transferring unit (not shown) constituting one stage of the rack unit U1. Subsequently, for example, an antireflection film forming process and/or cooling process, as the pre-treatment for the coating process, will be provided to the wafer W, in one rack of the rack units U1 to U3. Then, the resist liquid will be coated on the wafer W in the coating unit COT.

Thereafter, the wafer W will be baked (subjected to a baking process) in the baking unit constituting one rack of the rack units U1 to U3, then cooled, and carried into the interface block B3, via the transferring unit of the rack unit U3. In the interface block B3, the wafer W is transferred into the exposure apparatus B4, via a transfer route of, for example, the transferring means A4 to rack unit U6 to transferring means A5, and then subjected to the exposure process. After the exposure process, the wafer W will be transferred up to the main transferring means A2, by the opposite route, and then subjected to the developing process in the developing unit DEV, thereby forming a resist mask provided with a resist pattern. Thereafter, the wafer W is returned to the original carrier 1 placed on the placing table 90a.

The invention claimed is:

1. A developing method, comprising the steps of:
holding a substrate, horizontally, on a substrate holding part, the substrate having been coated with a resist and then subjected to an exposure process;
supplying a developing solution from a first developing solution nozzle onto either one of a central portion or peripheral portion of a surface of the substrate, so as to form a ribbon-like region on the surface of the substrate, while rotating the substrate about a vertical axis via the substrate holding part, wherein one end of the ribbon-like region is oriented toward the central portion of the substrate;
shifting a position of the ribbon-like region, in which the developing solution is supplied, from either one of the central portion or peripheral portion of the surface of the substrate toward the other of the central portion or peripheral portion thereof, while orienting the one end of the ribbon-like region of the developing solution toward the central portion of the substrate, thereby forming a liquid film of the developing solution on the surface of the substrate; and
supplying the developing solution from a second developing solution nozzle, so as to form a circular region on the central portion of the substrate or form a ribbon-like region shorter in length than the ribbon-like region of the developing solution supplied from the first developing nozzle, in order to prevent the liquid film of the developing solution from being dried up, while rotating the substrate about the vertical axis via the substrate holding part, thereby spreading the developing solution toward the peripheral portion of the substrate by centrifugal force.

2. The developing method according to claim 1, wherein the position of the ribbon-like region, in which the developing solution is supplied, is shifted from the peripheral portion toward the central portion of the substrate, by moving the first developing solution nozzle in a horizontal direction.

3. The developing method according to claim 2, wherein a flow rate of the developing solution supplied from the second developing solution nozzle is less than the flow rate of the developing solution supplied from the first developing solution nozzle.

4. The developing method according to claim 3, wherein the first developing solution nozzle includes a first discharging hole having a flat opening.

5. The developing method according to claim 3, wherein the second developing solution nozzle includes a second discharging hole having a generally circular opening.

6. The developing method according to claim 1, wherein a flow rate of the developing solution supplied from the second developing solution nozzle is less than the flow rate of the developing solution supplied from the first developing solution nozzle.

7. The developing method according to claim 6, wherein the first developing solution nozzle includes a first discharging hole having a flat opening.

8. The developing method according to claim 6, wherein the second developing solution nozzle includes a second discharging hole having a generally circular opening.

9. The developing method according to claim 1, wherein the first developing solution nozzle includes a first discharging hole having a flat opening.

10. The developing method according to claim 1, wherein the second developing solution nozzle includes a second discharging hole having a generally circular opening.

11. A developing apparatus, comprising:
a substrate holding part adapted for horizontally holding a substrate having been coated with a resist and then subjected to an exposure process;
a rotation driving mechanism adapted for rotating the substrate holding part holding the substrate, about a vertical axis;
a first developing solution nozzle adapted for supplying a developing solution onto a surface of the substrate, so as to form a ribbon-like region of the developing solution extending in a direction from a central portion toward a peripheral portion of the substrate, while one end of the ribbon-like region is oriented toward the central portion of the substrate, thereby forming a liquid film of the developing solution;
a driving mechanism adapted for moving the first developing solution nozzle, so as to shift a position of the ribbon-like region, in which the developing solution is supplied, from either one of the central portion or peripheral portion of the surface of the substrate toward the other of the central portion or peripheral portion thereof, while the one end of the ribbon-like region of the developing solution is oriented toward the central portion of the substrate; and
a second developing solution nozzle adapted for supplying the developing solution, so as to form a circular region on the central portion of the substrate or form a ribbon-like region shorter in length than the ribbon-like region of the developing solution supplied from the first developing nozzle, in order to prevent the liquid film of the developing solution from being dried up.

12. The developing apparatus according to claim 11, wherein the driving mechanism is configured for shifting the position of the ribbon-like region, in which the developing solution is supplied, from the peripheral portion toward the central portion of the substrate.

13. The developing apparatus according to claim 12, wherein a flow rate of the developing solution supplied from the second developing solution nozzle is less than the flow rate of the developing solution supplied from the first developing solution nozzle.

14. The developing apparatus according to claim 13, wherein the first developing solution nozzle includes a first discharging hole having a flat opening.

15. The developing apparatus according to claim 13, wherein the second developing solution nozzle includes a second discharging hole having a generally circular opening.

16. The developing apparatus according to claim 13, wherein the first developing solution nozzle and second developing solution nozzle are provided to a common arm provided to the driving mechanism.

17. The developing apparatus according to claim 11, wherein a flow rate of the developing solution supplied from the second developing solution nozzle is less than the flow rate of the developing solution supplied from the first developing solution nozzle.

18. The developing apparatus according to claim 17, wherein the first developing solution nozzle includes a first discharging hole having a flat opening.

19. The developing apparatus according to claim 17, wherein the second developing solution nozzle includes a second discharging hole having a generally circular opening.

20. The developing apparatus according to claim 17, wherein the first developing solution nozzle and second developing solution nozzle are provided to a common arm provided to the driving mechanism.

21. The developing apparatus according to claim 11, wherein the first developing solution nozzle includes a first discharging hole having a flat opening.

22. The developing apparatus according to claim 11, wherein the second developing solution nozzle includes a second discharging hole having a generally circular opening.

23. The developing apparatus according to claim 11, wherein the first developing solution nozzle and second developing solution nozzle are provided to a common arm provided to the driving mechanism.

24. A storage medium for storing therein a computer program for driving a computer to perform a developing method, the developing method comprising the steps of:
holding a substrate, horizontally, on a substrate holding part, the substrate having been coated with a resist and then subjected to an exposure process;
supplying a developing solution from a first developing solution nozzle onto either one of a central portion or peripheral portion of a surface of the substrate, so as to form a ribbon-like region on the surface of the substrate, while rotating the substrate about a vertical axis via the substrate holding part, wherein one end of the ribbon-like region is oriented toward the central portion of the substrate;
shifting a position of the ribbon-like region, in which the developing solution is supplied, from either one of the central portion or peripheral portion of the surface of the substrate toward the other of the central portion or peripheral portion thereof, while keeping orienting the one end of the ribbon-like region of the developing solution toward the central portion of the substrate, thereby forming a liquid film of the developing solution on the surface of the substrate; and supplying the developing solution from a second developing solution nozzle, so as to form a circular region on the central portion of the substrate or form a ribbon-like region shorter in length than the ribbon-like region of the developing solution supplied from the first developing nozzle, in order to prevent the liquid film of the developing solution from being dried up, while rotating the substrate about the vertical axis via the substrate holding part, thereby spreading the developing solution toward the peripheral portion of the substrate by centrifugal force.

* * * * *